(12) United States Patent
Kakuta

(10) Patent No.: US 12,130,577 B2
(45) Date of Patent: Oct. 29, 2024

(54) POSITIONING MECHANISM

(71) Applicant: KYOCERA Document Solutions Inc., Osaka (JP)

(72) Inventor: Masayuki Kakuta, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 18/283,129

(22) PCT Filed: Feb. 28, 2022

(86) PCT No.: PCT/JP2022/008283
§ 371 (c)(1),
(2) Date: Sep. 20, 2023

(87) PCT Pub. No.: WO2022/209513
PCT Pub. Date: Oct. 6, 2022

(65) Prior Publication Data
US 2024/0152087 A1    May 9, 2024

(30) Foreign Application Priority Data

Mar. 29, 2021  (JP) ................................ 2021-054887

(51) Int. Cl.
*G03G 21/16*     (2006.01)
(52) U.S. Cl.
CPC ..... *G03G 21/1604* (2013.01); *G03G 21/1647* (2013.01); *G03G 2221/1696* (2013.01)

(58) Field of Classification Search
CPC .... G03G 15/00; G03G 21/16; G03G 21/1604; G03G 21/1647; G03G 2221/1696; B41J 29/00; H05K 5/02
See application file for complete search history.

(56) References Cited

U.S. PATENT DOCUMENTS

2004/0208669 A1* 10/2004 Tokishige .......... G03G 21/1652
399/107
2014/0001696 A1* 1/2014 Yoshida .................. G03G 21/16
271/9.01

FOREIGN PATENT DOCUMENTS

JP        2012008460 A    1/2012

\* cited by examiner

*Primary Examiner* — Sophia S Chen
(74) *Attorney, Agent, or Firm* — IP Business Solutions, LLC

(57) ABSTRACT

A positioning mechanism includes two adjusting devices. The adjusting device includes: a shaft that extends between a first apparatus and a second apparatus in a facing direction where the first and second apparatus face each other and has an outer peripheral surface with a threaded portion formed therein; a holding member that is provided on the first apparatus, has a threaded hole formed through in the facing direction, and holds the shaft member passing through the threaded hole; an abutment member that is provided on an end of the shaft member close to the second apparatus and abuts on a connectable surface of the second apparatus and a compression coil spring that is disposed to surround the shaft member and the abutment member and is clamped and compressed between the holding member and the connectable surface of the second apparatus.

6 Claims, 5 Drawing Sheets

POSITIONING MECHANISM

TECHNICAL FIELD

The present invention relates to positioning mechanisms.

BACKGROUND ART

Generally, an image forming apparatus may be externally provided with an optional apparatus, such as a post-processing apparatus or an intermediate processing apparatus. The post-processing apparatus subjects a printed sheet ejected from the image forming apparatus to post-processing (such as punching or piercing). The intermediate processing apparatus feeds to the post-processing device the sheet ejected from the image forming apparatus.

For example, as disclosed in Patent Literature 1, such an optional apparatus is detachably connected through a connecting mechanism to a side surface of the image forming apparatus. The connecting mechanism includes a connecting band plate mounted to a surface of the image forming apparatus with which the post-processing apparatus is fitted. The connecting band plate is supported slidably in a direction orthogonal to a height direction on the image forming apparatus. When the connecting band plate is slid with the post-processing apparatus facing the side surface of the image forming apparatus, slots formed in the connecting band plate engage with rods projecting from the post-processing apparatus.

CITATION LIST

Patent Literature

Patent Literature 1: JP-A-2012-8460

SUMMARY OF INVENTION

However, in the image forming apparatus disclosed in Patent Literature 1, an upper portion of an optional sheet feeder (a first apparatus) and an upper portion of the image forming apparatus (a second apparatus) are connected together, but a lower portion of the first apparatus is free of engagement. Therefore, there arises a problem that the upper and lower portions of the first apparatus may have different distances from the side surface of the second apparatus, that is, the first apparatus may lean with respect to the vertical direction.

The present invention has been made in view of the foregoing point and has an object of devising the structure of a positioning mechanism for adjusting the relative position between a first apparatus and a second apparatus connectable through a connecting mechanism to a side surface of the first apparatus, thus enabling positioning between the first and second apparatuses with an inexpensive structure where the number of parts is reduced as much as possible.

A positioning mechanism according to an aspect of the present invention includes an adjusting device that adjusts a relative position between a first apparatus and a second apparatus having a connectable surface to be connected through a connecting mechanism to a side surface of the first apparatus. The adjusting device includes: a shaft member that extends between the first apparatus and the second apparatus in a facing direction where the first and second apparatus face each other and has an outer peripheral surface in which a threaded portion is formed; a holding member that is provided on the first apparatus, has a threaded hole formed through in the facing direction, and holds the shaft member passing through the threaded hole; an abutment member that is provided on an end of the shaft member close to the second apparatus and abuts on the connectable surface of the second apparatus; and a compression coil spring that is disposed to surround the shaft member and the abutment member and is clamped and compressed between the holding member and the connectable surface of the second apparatus.

Advantageous Effects of Invention

The present invention devises the structure of a positioning mechanism for adjusting the relative position between a first apparatus and a second apparatus connectable through a connecting mechanism to a side surface of the first apparatus, thus enabling positioning between the first and second apparatuses with an inexpensive structure where the number of parts is reduced as much as possible.

DESCRIPTION OF EMBODIMENTS

Hereinafter, a description will be given of embodiments of the present invention with reference to the drawings. However, the present invention is not limited to the following embodiments.

Figure 1:
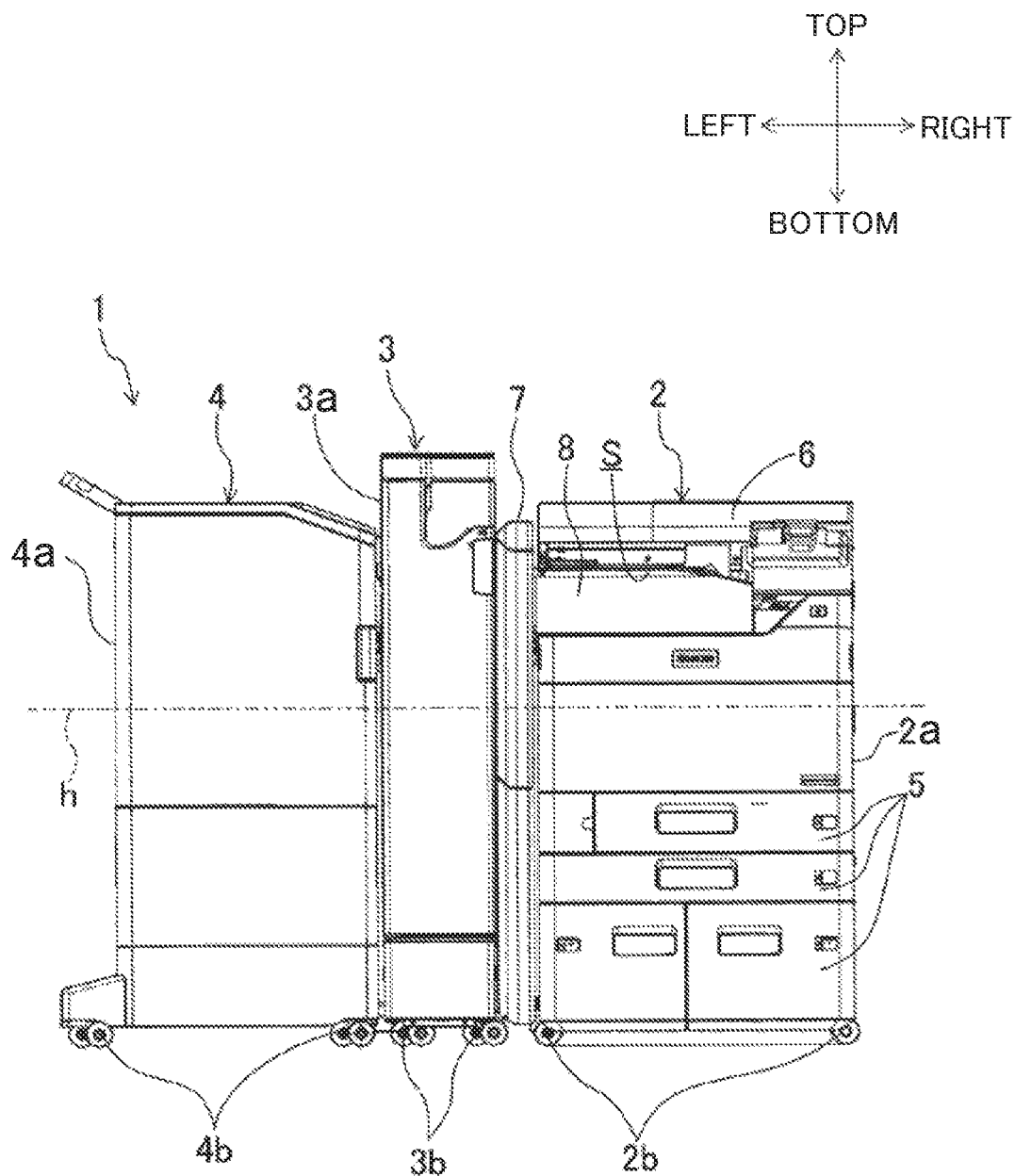
FIG. 1 is a frontal view showing an image formation system including a positioning mechanism according to an embodiment of the present invention.
Figure 2:
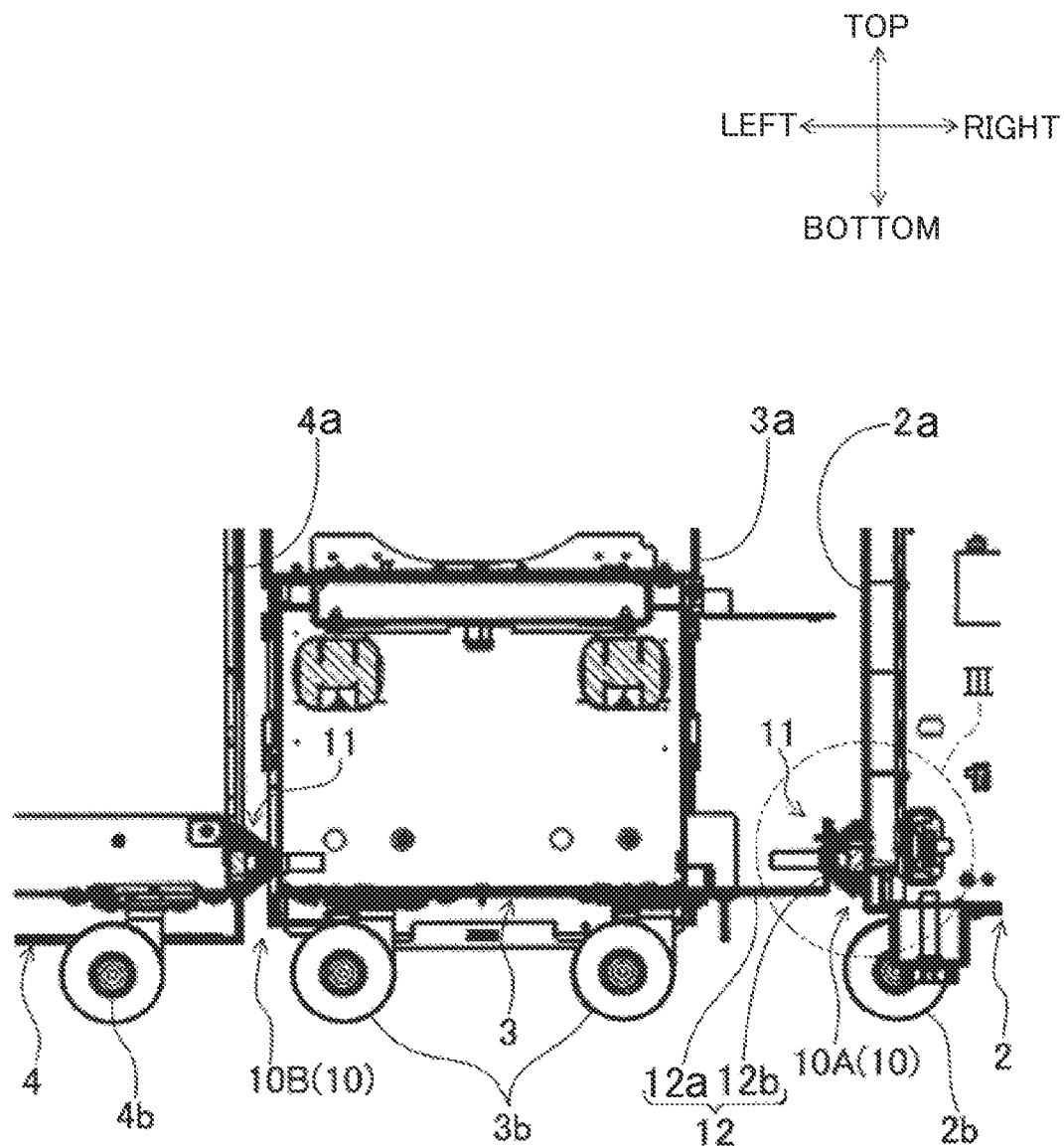
FIG. 2 is a vertical cross-sectional view showing connection structures of a second post-processing apparatus and an image forming apparatus relative to a first post-processing apparatus.

FIGS. 1 and 2 show an image formation system 1 including a positioning mechanism 10 according to this embodiment. In the following description, the terms "front" and "back" means the front side and back side, respectively, of the image formation system 1 (the front and back sides of the vertical plane of FIG. 1) and the terms "left" and "right" means the left side and right side, respectively, of the image formation system 1 when viewed from the front side.

As shown in FIG. 1, the image formation system 1 includes an image forming apparatus 2, a first post-processing apparatus 3, and a second post-processing apparatus 4. The image forming apparatus 2, the first post-processing apparatus 3, and the second post-processing apparatus 4 are arranged adjacent to one another in this order in a direction from right to left. A positioning mechanism 10 (see FIG. 2) is disposed between each adjacent pair of the apparatuses 2 to 4.

The image forming apparatus 2 is a multifunction peripheral of an in-body sheet ejection type in this example. The image forming apparatus 2 includes a housing 2a. The housing 2a has the shape of a vertically elongated rectangular box. Casters 2b for travel are mounted to the bottom surface of the housing 2a. Sheet feed cassettes 5 capable of containing sheets are disposed in a lower portion of the housing 2a of the image forming apparatus 2 in a manner withdrawable from the housing 2a. An image reading device 6 capable of reading an image of an original document and generating image data from the image is provided on top of the housing 2a. An image forming device is contained in a space of the housing 2a located above the sheet feed cassettes 5. The image forming device performs processing for printing on a sheet an image based on image data generated by the image reading device 6 or image data received from an external terminal.

An in-body sheet ejection space S is secured between the top surface of the housing 2a and the image reading device 6. In this example, the in-body sheet ejection space S is fitted with an intermediate conveying device 8. A sheet ejected from the image forming apparatus 2 is fed through the intermediate conveying device 8 to the first post-processing apparatus 3.

The first post-processing apparatus 3 receives the sheet fed from the intermediate conveying device 8 and subjects the sheet to first post-processing. The first post-processing apparatus 3 includes a housing 3a. The housing 3a is formed into a rectangular box shape larger in height than the image forming apparatus 2. When viewed from the front, the housing 3a has a vertically elongated shape the vertical dimension of which is five or more times larger than the width thereof. Casters 3b for travel are mounted to the bottom surface of the housing 3a.

The second post-processing apparatus 4 receives the sheet ejected from the first post-processing apparatus 3 and subjects the sheet to second post-processing. The second post-processing apparatus 4 includes a housing 4a. The housing 4a has a rectangular box shape having approximately the same height as the image forming apparatus 2. Casters 4b for travel are mounted to the bottom surface of the housing 4a.

Examples of post-processing performed by the first post-processing apparatus 3 and the second post-processing apparatus 4 include stapling, piercing, and punching. Although in this example the post-processing performed by the first post-processing apparatus 3 and the post-processing performed by the second post-processing apparatus 4 are different, the same processing may be performed on both the post-processing apparatuses.

The first post-processing apparatus 3 and the image forming apparatus 2 are connected by a first connecting mechanism. In addition to the first connecting mechanism, an intermediate conveyance path is provided between the first post-processing apparatus 3 and the image forming apparatus 2. The first connecting mechanism and the intermediate conveyance path are covered with a cover member 7 to make them invisible externally. The second post-processing apparatus 4 and the first post-processing apparatus 3 are connected by a second connecting mechanism. A well-known connecting mechanism, for example, one disclosed in JP-A-2012-8460, may be adopted as each of the first connecting mechanism and the second connecting mechanism. Specifically, each connecting mechanism includes: a connecting metal plate provided slidably in a front-to-back direction on a side surface of the first post-processing apparatus 3; and projecting pins projecting from a side surface of a counter apparatus facing the side surface of the first post-processing apparatus 3. The projecting pins are formed with their respective D-shaped cutouts. The connecting plate is formed with engagement holes engageable with the D-shaped cutouts.

When the connecting metal plate is slid from a non-connecting position toward the front, the engagement holes in the connecting metal plate engage with the two-sided chamfered portions of the projecting pins and, thus, the first post-processing apparatus 3 and the counter apparatus (the image forming apparatus 2 or the second post-processing apparatus 4) are connected together against separation. Each connecting mechanism is provided relatively high away from the floor, for example, as shown in the dash-double-dot line h of FIG. 1 (higher than the vertically middle position of the first post-processing apparatus 3 in this example).

As shown in FIG. 2, a first positioning mechanism 10A is provided between the lower end of the first post-processing apparatus 3 and the lower end of the image forming apparatus 2. A second positioning mechanism 10B is provided between the lower end of the first post-processing apparatus 3 and the lower end of the second post-processing apparatus 4.

Each of the first positioning mechanism 10A and the second positioning mechanism 10b includes two adjusting devices 11. The first positioning mechanism 10A and the second positioning mechanism 10B have fundamentally the same structure except that they are different in location where the two adjusting devices 11 are mounted. Specifically, in the first positioning mechanism 10A, the two adjusting devices 11 are mounted through an extending metal plate 12 to the housing 2a. On the other hand, in the second positioning mechanism 10B, the two adjusting devices 11 are mounted directly to the housing 4a.

Figure 3:
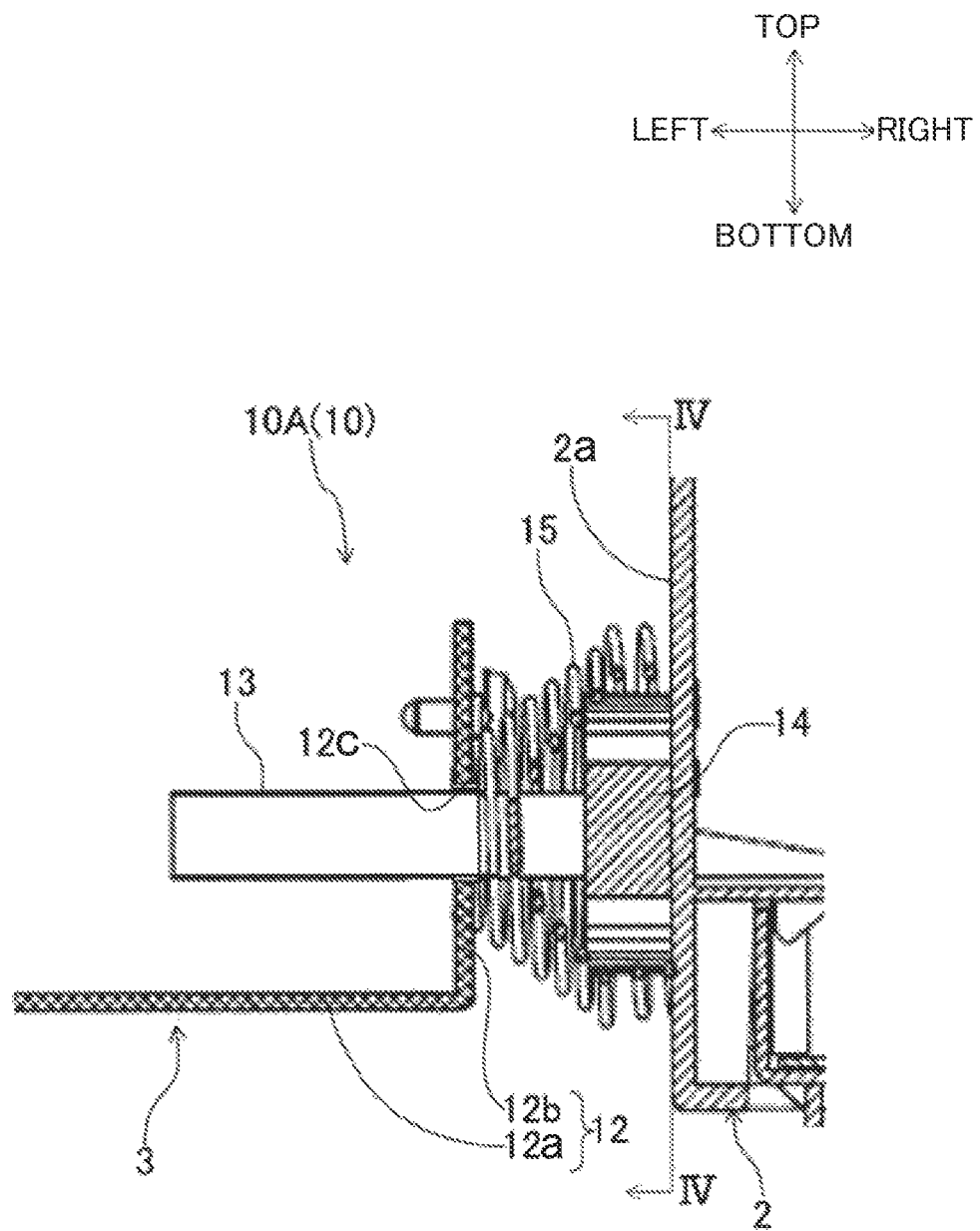
FIG. 3 is an enlarged view showing the portion III in FIG. 2 on an enlarged scale.
Figure 4:
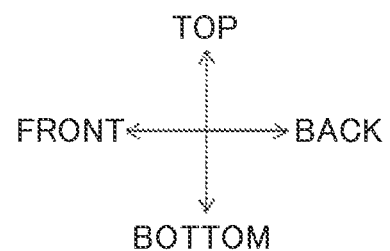
FIG. 4 is a cross-sectional view taken along the line IV-IVI in FIG. 3.
Figure 4:
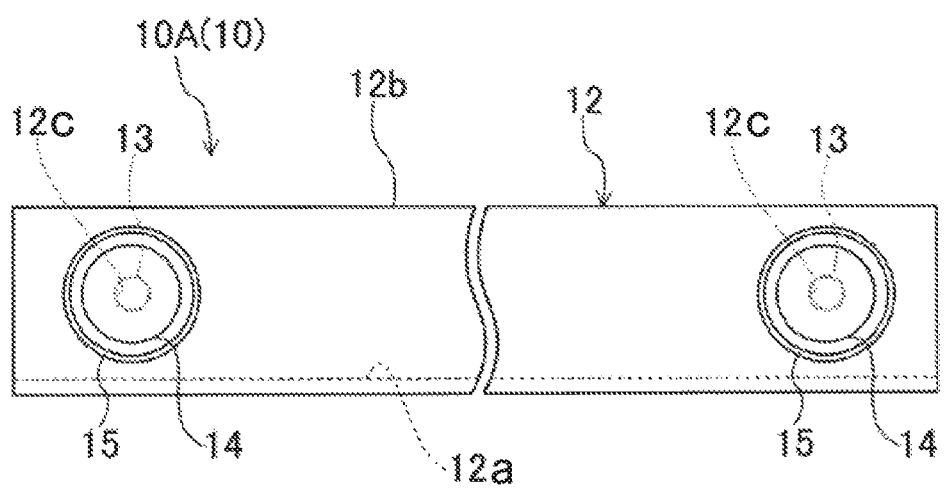

A description will be given of the structure of the first positioning mechanism 10A with reference to FIGS. 3 and 4. As for the second positioning mechanism 10B, a detailed description thereof will be omitted since it has the same fundamental structure as the first positioning mechanism 10A.

The first positioning mechanism 10A includes the two adjusting devices 11 mounted to the extending metal plate 12. The extending metal plate 12 includes a horizontal plate portion 12a and a vertical plate portion 12b (an example of the holding member). The horizontal plate portion 12a extends rightward from the lower end of the housing 3a of the first post-processing apparatus 3 and throughout the entire dimension of the housing 3a in the front-to-back direction. The vertical plate portion 12b extends upward from an edge of the horizontal plate portion 12a. As shown in FIG. 4, the vertical plate portion 12b has a rectangular plate shape elongated in the front-to-back direction. Both end portions of the vertical plate portion 12b are formed with threaded holes 12c threadedly engageable with shaft members 13 to be described hereinafter. Each threaded hole 12c penetrates the vertical plate portion 12b in a right-and-left direction (a thickness direction).

The two adjusting devices 11 are arranged axisymmetrically with respect to a line passing through the center of the vertical plate portion 12b in the front-to-back direction. Each adjusting device 11 includes a shaft member 13, an abutment member 14, and a compression coil spring 15. The outer peripheral surface of the shaft member 13 is formed with an external thread throughout the entire length along an axial direction thereof. The shaft members 13 pass through the respectively associated threaded holes 12c formed in the vertical plate portion 12b while being threadedly engaged in the threaded holes 12c.

The abutment member 14 is formed of a disc-shaped rubber member fixed to a leading end of the shaft member 13. The shape of the abutment member 14 is not limited to the above shape and the abutment member 14 may be formed, for example, in a polygonal shape. The material making up the abutment member 14 is not limited to rubber and the abutment member 14 may be made of, for example, a resin material or a metallic material.

The compression coil spring 15 is formed to surround a portion of the shaft member 13 located on the leading end side (the right side) thereof beyond the vertical plate portion 12b and the abutment member 14. In other words, the portion of the shaft member 13 located on the leading end side thereof and the abutment member 14 are disposed radially inwardly of the compression coil spring 15. The compression coil spring 15 is made of a conductive metallic material. In this embodiment, the compression coil spring 15 is externally fitted on and freely supported by the shaft member 13 and the abutment member 14 without being anchored to any other member. The compression coil spring 15 is formed to increase its coil diameter from its base end toward its leading end. The coil diameter (the inside diameter) of the base end of the compression coil spring 15 is smaller than the outside diameter of the abutment member 14. Therefore, the compression coil spring 15 is prevented from falling out of the abutment member 14 on the leading end side (the right side). In a state where the image forming apparatus 2 and the first post-processing apparatus 3 are connected together, the compression coil spring 15 abuts on the right side surface of the vertical plate portion 12b of the extending metal plate 12 and the left side surface of the housing 2a and thus makes both the extending metal plate 12 and the housing 2a electrically conductive. As a result, the compression coil spring 15 functions as a ground member for grounding the first post-processing apparatus 3.

In connecting the first post-processing apparatus 3 to the left side surface of the image forming apparatus 2, the position of the leading end surface of the abutment member 14 is first adjusted by adjusting the amount of projection of the shaft member 13 to the right from the vertical plate portion 12b while rotating the shaft member 13. Thereafter, the first post-processing apparatus 3 is slowly moved closer to the image forming apparatus 2. As a result, the abutment member 14 abuts on the left side surface of the image forming apparatus 2 to restrict the distance between the lower end of the image forming apparatus 2 and the lower end of the first post-processing apparatus 3 and, concurrently, the compression coil spring 15 is clamped and compressed between the housing 2a of the image forming apparatus 2 and the housing 3a of the first post-processing apparatus 3. When, in this state, an operator operates the connecting mechanism, the image forming apparatus 2 and the first post-processing apparatus 3 are connected and secured together.

In a state where the image forming apparatus 2 and the first post-processing apparatus 3 are connected together, the leaning of the first post-processing apparatus 3 is corrected by the restoring force of the compression coil spring 15. In addition, since the abutment member 14 abuts on the left side surface of the housing 2a of the image forming apparatus 2, the distance between the image forming apparatus 2 and the first post-processing apparatus 3 is restricted to a distance adjusted by the operator. Thus, it can be prevented that when the upper portion of the image forming apparatus 2 and the upper portion of the first post-processing apparatus 3 are connected together by the connecting mechanism, the lower portion of the first post-processing apparatus 3 does not follow the connecting force of the connecting mechanism and, thus, the first post-processing apparatus 3 leans to the right and left.

Figure 5:
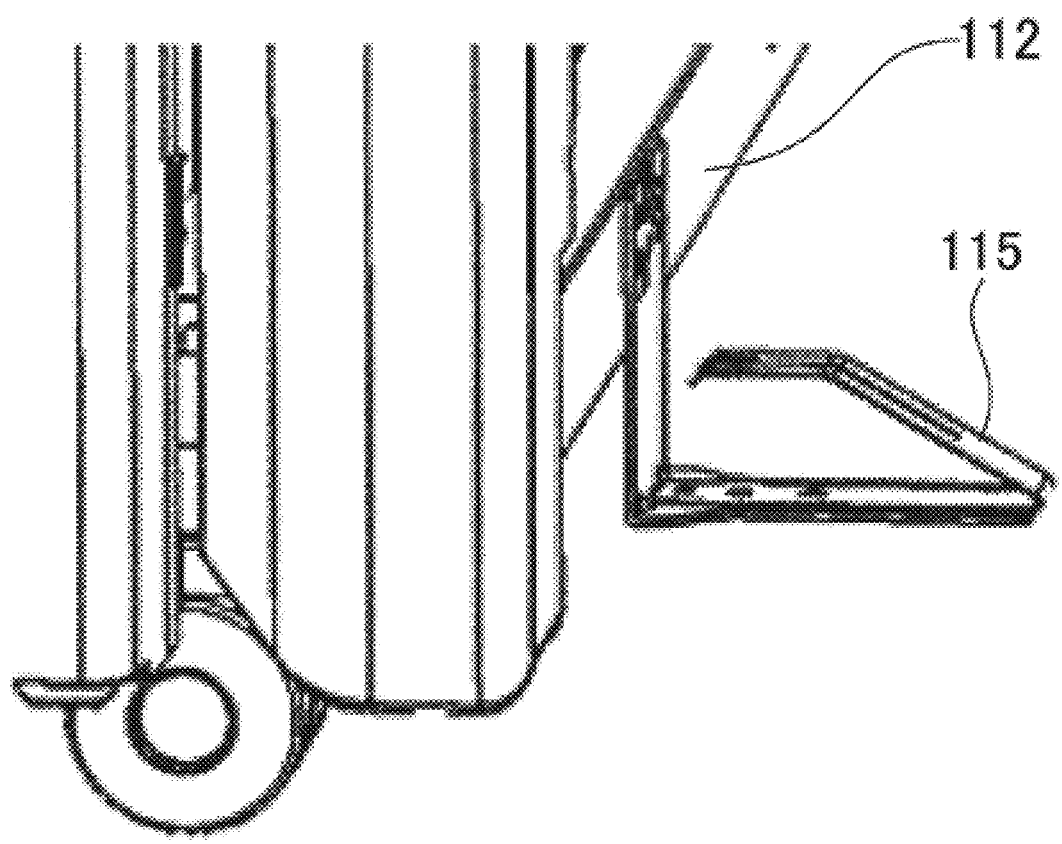
FIG. 5 is a perspective view showing a ground member of a first post-processing apparatus according to a comparative example.

In the above embodiment, the compression coil spring 15 is made of a conductive metallic material. As a result, the compression coil spring 15 functions also as a ground member for the first post-processing apparatus 3, which reduces the number of parts and thus enables reduction in product cost. For example, in a structure where a ground member 115 is supported in a cantilever manner by a vertical plate portion 112 as shown as a comparative example in FIG. 5, the ground member 115 may be easily broken by an external force. In contrast, in the above embodiment, since the shaft member 13 and the abutment member 14 are disposed radially inwardly of the compression coil spring 15 functioning as a ground member, the compression coil spring 15 does not deform largely even if a radial external force acts on the compression coil spring 15. As a result, the compression coil spring 15 can be prevented from being broken by the radial external force.

In the above embodiment, the compression coil spring 15 is formed to increase its coil diameter from its base end toward its leading end in the axial direction of the shaft member 13. The coil diameter (the inside diameter) of the base end of the compression coil spring 15 is smaller than the outside diameter of the abutment member 14. Therefore, the compression coil spring 15 can be prevented from falling out of the abutment member 14 on the leading end side.

In the above embodiment, the two adjusting devices 11 are arranged axisymmetrically with respect to the line passing through the center of the right side surface of the first post-processing apparatus 3 in the front-to-back direction. As a result, the first post-processing apparatus 3 can be prevented from leaning to the right and left when viewed in plan.

The same effects can be achieved also as to the second positioning mechanism 10B provided between the second post-processing apparatus 4 and the first post-processing apparatus 3. In the second positioning mechanism 10B, a side surface of the housing 4a facing the first post-processing apparatus 3 functions as the holding member. Specifically, both end portions of the side surface of the housing 4a facing the first post-processing apparatus 3 are formed with threaded holes 12c threadedly engageable with shaft members 13.

OTHER EMBODIMENTS

Although in the above embodiment the first post-processing apparatus 3 is used as the first apparatus and the image forming apparatus 2 or the second post-processing apparatus 4 is used as the second apparatus, the present invention is not limited to this embodiment. The first apparatus and the second apparatus may be any apparatuses.

INDUSTRIAL APPLICABILITY

As seen from the above, the present invention is useful for a positioning mechanism and useful particularly when applied to an image forming apparatus, such as a printer, a facsimile machine, a copier or a multifunction peripheral (MFP).

The invention claimed is:
1. A positioning mechanism comprising an adjusting device that adjusts a relative position between a first apparatus and a second apparatus having a connectable surface to be connected through a connecting mechanism to a side surface of the first apparatus,
the adjusting device comprising:
a shaft member that extends between the first apparatus and the second apparatus in a facing direction where the first and second apparatus face each other and has an outer peripheral surface in which a threaded portion is formed;
a holding member that is provided on the first apparatus, has a threaded hole formed through in the facing direction, and holds the shaft member passing through the threaded hole;
an abutment member that is provided on an end of the shaft member close to the second apparatus and abuts on the connectable surface of the second apparatus; and
a compression coil spring that is disposed to surround the shaft member and the abutment member and is clamped and compressed between the holding member and the connectable surface of the second apparatus.

2. The positioning mechanism according to claim 1, wherein the compression coil spring is made of a conductive metallic material.

3. The positioning mechanism according to claim 1, wherein the compression coil spring is formed to increase a coil diameter thereof from a base end thereof toward a leading end thereof in an axial direction of the shaft member.

4. The positioning mechanism according to claim 3, wherein the coil diameter of the base end of the compression coil spring is smaller than an outside diameter of the abutment member.

5. The positioning mechanism according to claim 1, wherein
the adjusting device comprises two adjusting devices, and
the two adjusting devices are arranged axisymmetrically with respect to a line passing through a center of the side surface of the first apparatus in a front-to-back direction orthogonal to the facing direction.

6. The positioning mechanism according to claim 1, wherein
the first apparatus is a first post-processing apparatus that subjects a sheet ejected from an image forming apparatus to first post-processing, and
the second apparatus is the image forming apparatus or a second post-processing apparatus that is different from the first post-processing apparatus and subjects the sheet to second post-processing.

* * * * *